US008713495B2

(12) United States Patent
Aliseychik et al.

(10) Patent No.: US 8,713,495 B2
(45) Date of Patent: Apr. 29, 2014

(54) ACCELERATOR FOR A READ-CHANNEL DESIGN AND SIMULATION TOOL

(71) Applicant: LSI Corporation, San Jose, CA (US)

(72) Inventors: Pavel Aleksandrovich Aliseychik, Moscow (RU); Aleksey Alexandrovich Letunovskiy, Tokarevka (RU); Alexander Alexandrovich Petyushko, Bryansk (RU); Denis Vladimirovich Parkhomenko, Moscow (RU); Alexander Borisovich Kholodenko, Moscow (RU)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/780,222

(22) Filed: Feb. 28, 2013

(65) Prior Publication Data

US 2014/0053121 A1 Feb. 20, 2014

(30) Foreign Application Priority Data

Aug. 16, 2012 (RU) ................................ 2012135285

(51) Int. Cl.
*G06F 17/50* (2006.01)

(52) U.S. Cl.
CPC ........ *G06F 17/5022* (2013.01); *G06F 17/5045* (2013.01)
USPC .............................. 716/106; 716/136; 703/13

(58) Field of Classification Search
None
See application file for complete search history.

(56) References Cited

U.S. PATENT DOCUMENTS

| 6,438,180 | B1 | 8/2002 | Kavcic et al. | |
| 7,519,898 | B2 * | 4/2009 | Narayanan et al. | 714/801 |
| 7,990,642 | B2 * | 8/2011 | Lee et al. | 360/31 |
| 8,117,515 | B2 | 2/2012 | Yang | |
| 8,144,757 | B2 * | 3/2012 | Morris et al. | 375/227 |
| 8,291,299 | B2 * | 10/2012 | Li et al. | 714/774 |
| 8,407,553 | B2 * | 3/2013 | Gunnam | 714/752 |

FOREIGN PATENT DOCUMENTS

WO WO2010019168 A1 2/2010

OTHER PUBLICATIONS

Chen, J., et al., "Approaching the Slepian-Wolf Limit with LDPC Coset Codes." Draft, pp. 1-19.
Forney, G.D., Jr., "The Viterbi Algorithm," Proceedings of the IEEE, vol. 61, No. 3, pp. 268-278, Mar. 1973.
Galbraith, R., et al., "Iterative Detection Read Channel Technology in Hard Disk Drives", Internet Citation, Oct. 2008, pp. 1-4.
Gallager, R. G. "Low Density Parity—Check Codes",Cambridge Mass Jul. 1963, pp. 1-90.
Jackson, R. C. "Data detection algorithms for perpendicular magnetic recording in the presence of strong media noise." PhD thesis, University of Warwick, Dec. 2008, pp. 1-243.

(Continued)

*Primary Examiner* — Leigh Garbowski
(74) *Attorney, Agent, or Firm* — Mendelsohn, Drucker & Dunleavy, P.C.; Yuri Gruzdkov; Steve Mendelsohn (57) ABSTRACT

A computer-aided design method for developing, simulating, and testing a read-channel architecture to be implemented in a VLSI circuit. The method uses a coset operating mode and nonzero-syndrome-based decoding to accelerate the simulation of the read-channel's error-rate characteristics corresponding to different parity-check matrices employed in the read-channel's turbo-decoder, such as a low-density parity-check decoder. The acceleration is achieved through recycling some previously generated log-likelihood-ratio values, which enables the method to sometimes bypass certain time-consuming processing steps therein.

19 Claims, 7 Drawing Sheets

(56) References Cited

OTHER PUBLICATIONS

Kavcic, A., et al., "A signal-dependent autoregressive channel model," Magnetics, IEEE Transactions on, vol. 35, No. 5, pp. 2316,2318, Sep. 1999.
Lay, K., et al., "Nonhomogeneous LDPC Codes and Their Application to Encrypted Communication", 2011 Third International Conference on Communications and Mobile Computing, 2011, pp. 353-357.
Li, G., et al., "Generalized reliability-based syndrome decoding of LDPC codes." European Transactions on Telecommunications, vol. 19, Issue 8, pp. 873-877, Dec. 2008.
Sawaguchi, H., et al., "Iterative decoding for concatenated error correction coding in PRML channel systems," Global Telecommunications Conference, 1999, vol. 1B, No., pp. 749,754 vol. 1b, 1999.
Song, H., et al., "Iterative decoding for partial response (PR), equalized, magneto-optical (MO) data storage channels," Selected Areas in Communications, IEEE Journal on, vol. 19, No. 4, pp. 774,782, Apr. 2001.
Souvignier, T., et al, "Turbo decoding for PR4: parallel versus serial concatenation," International Conference on Communications, vol. 3, pp. 1638-1642, 1999.
Wang, C., et al., On the Typicality of the Linear Code Among the LDPC Coset Code Ensemble, published in the proceedings of the 2005 Conference on Information Sciences and Systems, held at the Johns Hopkins University, on Mar. 16-18, 2005, pp. 1-6.
Welland, D., et al., "Implementation of a digital read/write channel with EEPR4 detection," Magnetics, IEEE Transactions on, vol. 31, No. 2, pp. 1180-1185, Mar. 1995.
XPPTechnologies, IEEE Std 802.16e™ LDPC Decoder, Revision1. 2, Aug. 31, 2006; WhitePaper. pp. 1-17.
Yeo, E., et al., "Implementation of high throughput soft output Viterbi decoders," IEEE Workshop on Signal Processing Systems, vol., No., pp. 146,151, Oct. 16-18, 2002.

* cited by examiner

ACCELERATOR FOR A READ-CHANNEL DESIGN AND SIMULATION TOOL

The size and complexity of very large-scale integrated (VLSI) circuits preclude manual design. Developers of VLSI circuits typically use specialized software tools in a workstation-based interactive environment. The computer-aided design flow usually includes a structured sequence of steps, beginning with the specification entry and ending with the generation of a database that enables the fabrication facility to fabricate, test, and program the resulting VLSI circuit. Multiple passes may be necessary through all or part of the computer-aided design flow before the corresponding database can be finalized for the fabrication facility.

As used in the relevant art, the term "read channel" refers to the circuitry that performs processing and decoding, such as turbo decoding, of the signals generated by a sensor, such as a magnetic read head, when accessing a corresponding storage medium, such as a magnetic disk platter. A read channel is typically implemented using one or more VLSI circuits. The development, design, simulation, refinement, and testing of a read-channel chip usually involves evaluation of a relatively large number of different turbo-decoders, e.g., based on their respective sector-failure rates (SFRs), bit-error rates (BERs), or other suitable error-rate measures.

In modern data-storage systems, error rates can be extremely low, such as $10^{-10}$ or lower in terms of the BER. At these error rates, meaningful characterization of the read channel with conventional design and simulation tools requires a relatively large number of simulations and/or relatively long simulation runs, which can take from several weeks to several months to complete even on multiprocessor clusters. Acceleration of this process is therefore desirable.

Disclosed herein are various embodiments of a computer-aided design method for developing, simulating, and testing a read-channel architecture to be implemented in a VLSI circuit. The method uses a coset operating mode and nonzero-syndrome-based decoding to accelerate the simulation of the read-channel's error-rate characteristics corresponding to different parity-check matrices employed in the read-channel's turbo-decoder, such as a low-density parity-check decoder. The acceleration is achieved through recycling some previously generated log-likelihood-ratio values, which enables the method to sometimes bypass certain time-consuming processing steps therein. Advantageously, the simulation process can be accelerated by up to a factor of about five or greater.

Figure 1:
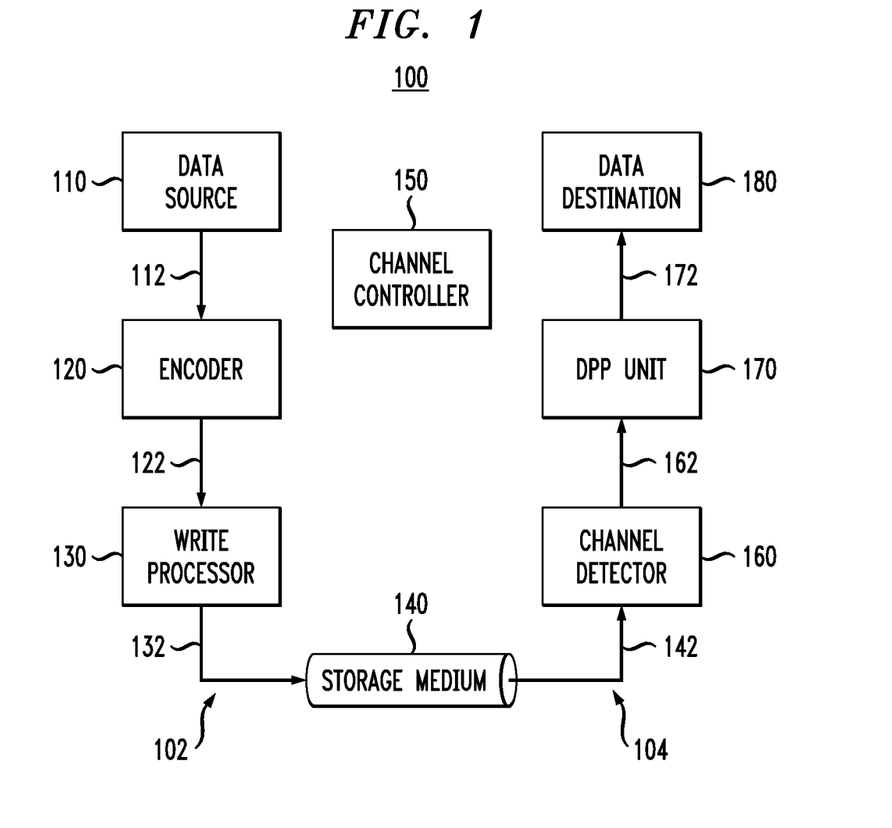
FIG. 1 shows a block diagram of a representative communication system having a read channel.

More specifically, FIG. 1 shows a block diagram of a communication system 100 having a write channel 102 and a read channel 104. Disposed between write channel 102 and read channel 104 is a storage medium 140 (e.g., a flash drive, a hard-drive platter, etc.) configured to receive data from the write channel for storage and make the stored data available for retrieval through the read channel. System 100 has a system controller 150 that controls the operations of write channel 102, read channel 104, and storage medium 140. In one embodiment, controller 150 is an ARM (Advanced RISC (reduced instruction-set code) Machine) processor.

In a representative embodiment, write channel 102 comprises a data source (e.g., input port) 110, a low-density parity-check (LDPC) encoder 120, and a write processor 130. In operation, data source 110 provides a set of bits 112, often referred to as an original information word, to LDPC encoder 120. LDPC encoder 120 encodes original information word 112 using an LDPC code to generate an original codeword 122, often referred to as the channel-input codeword. LDPC encoding is known in the art and is described in more detail, e.g., in International Patent Application Publication No. WO 2010/019168, which is incorporated herein by reference in its entirety. Original codeword 122 is supplied to write processor 130, which converts it into an appropriate write signal 132 and applies the write signal to storage medium 140. Write signal 132 controllably alters the state of storage medium 140, thereby causing original codeword 122 to be stored in the storage medium.

In a representative embodiment, read channel 104 comprises a channel detector 160, a decoding and post-processing (DPP) unit 170, and a data destination (e.g., output port) 180. To retrieve original codeword 122 from storage medium 140, channel detector 160 senses the corresponding location(s) in the storage medium to obtain a read signal 142. Channel detector 160 then converts read signal 142 into a corresponding set of log-likelihood-ratio (LLR) values 162 and supplies said LLR values to DPP unit 170.

In a representative implementation, an LLR value comprises (i) a sign bit that represents the detector's best guess (hard decision) regarding the bit value stored at the corresponding sensed location in storage medium 140 and (ii) one or more magnitude bits that represent the detector's confidence in the hard decision. For example, channel detector 160 may output each LLR value as a five-bit value, where the most-significant bit is the sign bit and the four least-significant bits are the confidence bits. For example, a five-bit LLR value of 00000 indicates a hard decision of 0 with minimum confidence, while a five-bit LLR value of 01111 indicates a hard decision of 0 with maximum confidence. Intermediate values (e.g., between 0000 and 1111) of confidence bits represent intermediate confidence levels. Similarly, a five-bit LLR value of 10001 indicates a hard decision of 1 with minimum confidence, while a five-bit LLR value of 11111 indicates a hard decision of 1 with maximum confidence, wherein the binary value of 10000 is unused.

DPP unit 170 performs LDPC decoding on LLR values 162, which, if necessary, is followed by the application of one or more post-processing (PP) methods. More specifically, DPP unit 170 is configured to apply PP methods when the LDPC-decoding process fails, meaning, e.g., that, after the maximum allotted number of iterations, the output word of the LDPC decoder (not explicitly shown in FIG. 1) still has one or more unsatisfied parity checks. Depending on the actual number of unsatisfied parity checks, DPP unit 170 might (1) send a request to channel controller 150 to have channel detector 160 reread the corresponding location(s) in storage medium 140 and then repeat the decoding process for the newly received LLR values 162 or (2) alter the input to the LDPC decoder and restart the LDPC iterations with the altered input, but without a reread.

DPP unit 170 typically uses the first option when the output vector of the failed LDPC decoder has a relatively large number (e.g., more than about sixteen) of unsatisfied parity checks. DPP unit 170 typically uses the second option when the output vector of the failed LDPC decoder has a relatively small number of unsatisfied parity checks. After the LDPC decoder converges on a valid codeword, DPP unit 170 converts this codeword into the corresponding original information word and directs said word, via an output signal 172, to data destination 180.

Figure 2:
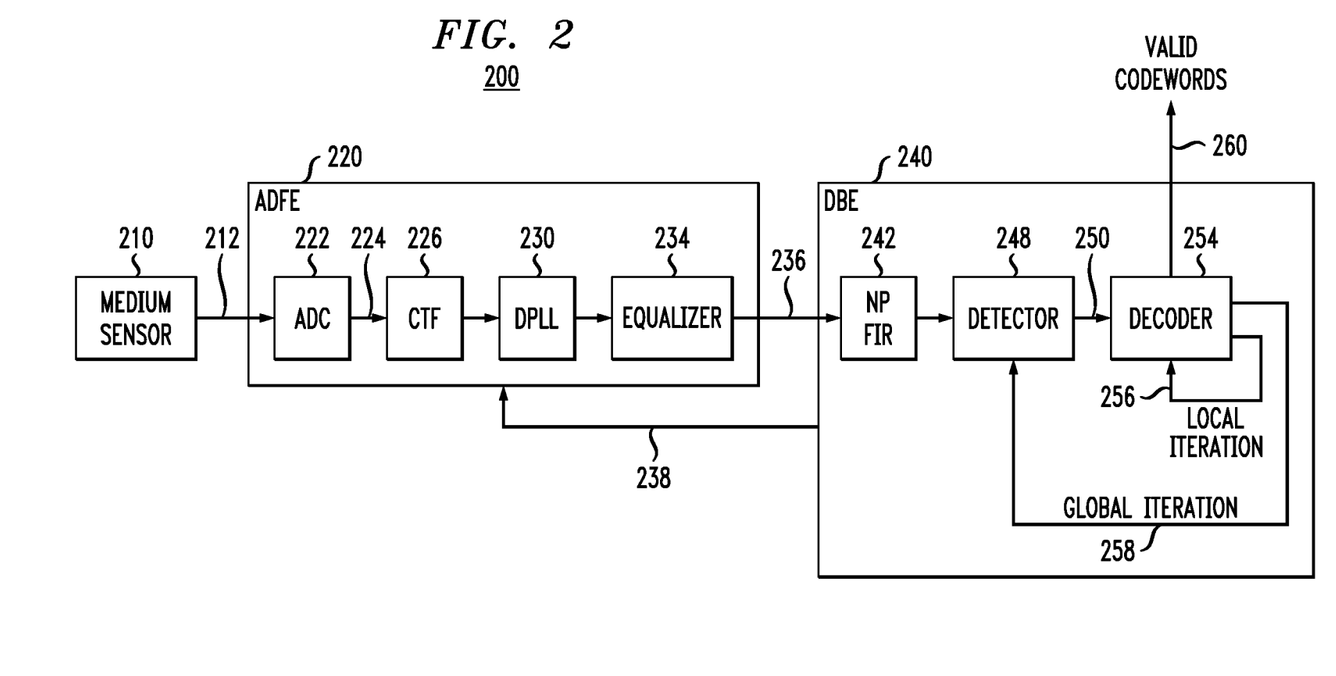
FIG. 2 shows a block diagram of a read channel that can be used to implement the read channel in the communication system shown in FIG. 1 according to one aspect of the disclosure.

FIG. 2 shows a block diagram of a read channel 200 that can be used to implement read channel 104 (FIG. 1) according to one aspect of the disclosure. Read channel 200 is shown as having three constituent modules: a storage-medium sensor 210, an analog-to-digital front end (ADFE) 220, and a digital back end (DBE) 240. A brief description of how each of these modules operates is given below. For illustration purposes, read channels 104 and 200 are described in reference to LDPC codes. One of ordinary skill in the art will appreciate that read channels 104 and 200 can also be designed/configured to use other types of error-correction codes, such as turbo-codes that are non-LDPC codes.

Sensor 210 is configured to (i) access various locations of the corresponding storage medium, such as storage medium 140 (FIG. 1); (ii) sense the state(s) of the physical carrier of information used therein; and (iii) generate a corresponding electrical signal 212 that represents the sensed state(s) of the physical carrier. For example, in one embodiment, sensor 210 can be a magnetic read head in a disk drive configured to move above the corresponding magnetic-disk platter and transform the platter's magnetic-field pattern into electrical current, thereby generating signal 212.

ADFE 220 has an analog-to-digital converter (ADC) 222 that converts signal 212 into a corresponding electrical digital signal 224 and applies the latter signal to a series of configurable filters comprising a continuous-time filter (CTF) 226, a digital phase-lock loop (DPLL) 230, and a waveform equalizer 234. CTF 226 operates to modify the frequency content of signal 224 in a specified manner that is beneficial to the subsequent signal processing. For example, CTF 226 may be configured to remove a dc component (if any) from signal 224 and attenuate certain frequencies dominated by noise or interference. DPLL 230 operates to extract a clock signal from the signal it receives from CTF 226. The extracted clock signal can then be used to more optimally sample the received signal for processing. Waveform equalizer 234 operates to adjust waveform shapes in the signal it receives from DPLL 230 to make them closer to optimal waveform shapes, the latter being the waveform shapes for which DBE 240 is designed and calibrated. The respective configurations of CTF 226, DPLL 230, and waveform equalizer 234 can be adjusted using a feedback signal 238 generated by DBE 240 based on the signal processing implemented therein.

DBE 240 includes a noise-predictive (NP) finite-impulse-response (FIR) equalizer 242, a sequence detector 248, and an LDPC decoder 254. NP-FIR equalizer 242 operates to reduce the amount of data-dependent, correlated noise in an output signal 236 generated by ADFE 220. Sequence detector 248 implements maximum-likelihood sequence estimation (MLSE) using a suitable MLSE algorithm, such as a Viterbi-like algorithm. For example, sequence detector 248 may operate to (i) emulate signal distortions, such as linear inter-symbol interference (ISI), in the preceding portion of read channel 200; (ii) compare the actual signal received from NP-FIR equalizer 242 with an anticipated distorted signal; and (iii) deduce the most likely stored sequence based on said comparison. An output signal 250 generated by sequence detector 248 contains a sequence of LLR values that represent the detector's confidence in the correctness of the deduced sequence.

Decoder 254 operates to convert the sequence of LLR values received via signal 250 into a corresponding valid codeword. A valid codeword is characterized in that all its parity checks defined by the code's parity-check matrix are satisfied (e.g., produce zeros). Therefore, decoder 254 first calculates the parity checks. If all parity checks are satisfied, then the decoding process is terminated, and decoder 254 outputs the codeword that satisfied the parity checks via an output signal 260. If some of the parity checks are not satisfied, then decoder 254 tries to converge on a valid codeword using an iterative process indicated in FIG. 2 by a looped arrow 256. In a representative embodiment, iterative process 256 is based on a message-passing or belief-propagation algorithm. After each iteration 256, decoder 254 recalculates the parity checks and, depending on the result, may either output a valid codeword via output signal 260 or proceed to perform another iteration 256.

If decoder 254 fails to converge on a valid codeword, e.g., after a specified maximum number of iterations 256, then the decoding process is temporarily halted, and the signal processing is directed back to detector 248 as indicated by a return arrow 258. Based on certain characteristics of the failed decoding process in decoder 254, the settings of sequence detector 248 are appropriately adjusted. Using the adjusted settings, sequence detector 248 regenerates the sequence of LLR values and provides the regenerated sequence to decoder 254 via signal 250. Decoder 254 then restarts the halted decoding process, now using the regenerated sequence of LLR values.

If detector 248 and decoder 254 fail to converge on a valid codeword, e.g., after a specified maximum number of restarts (global iterations), then the decoding process is terminated. In some configurations of read channel 200, after the decoding process has been terminated, a request may be sent to the channel controller (e.g., channel controller 150, FIG. 1) to initiate a reread of the corresponding piece of stored data from the storage medium (e.g., storage medium 140, FIG. 1). Alternatively or in addition, other PP options may be invoked to remedy the decoding-process failure.

Figure 3:
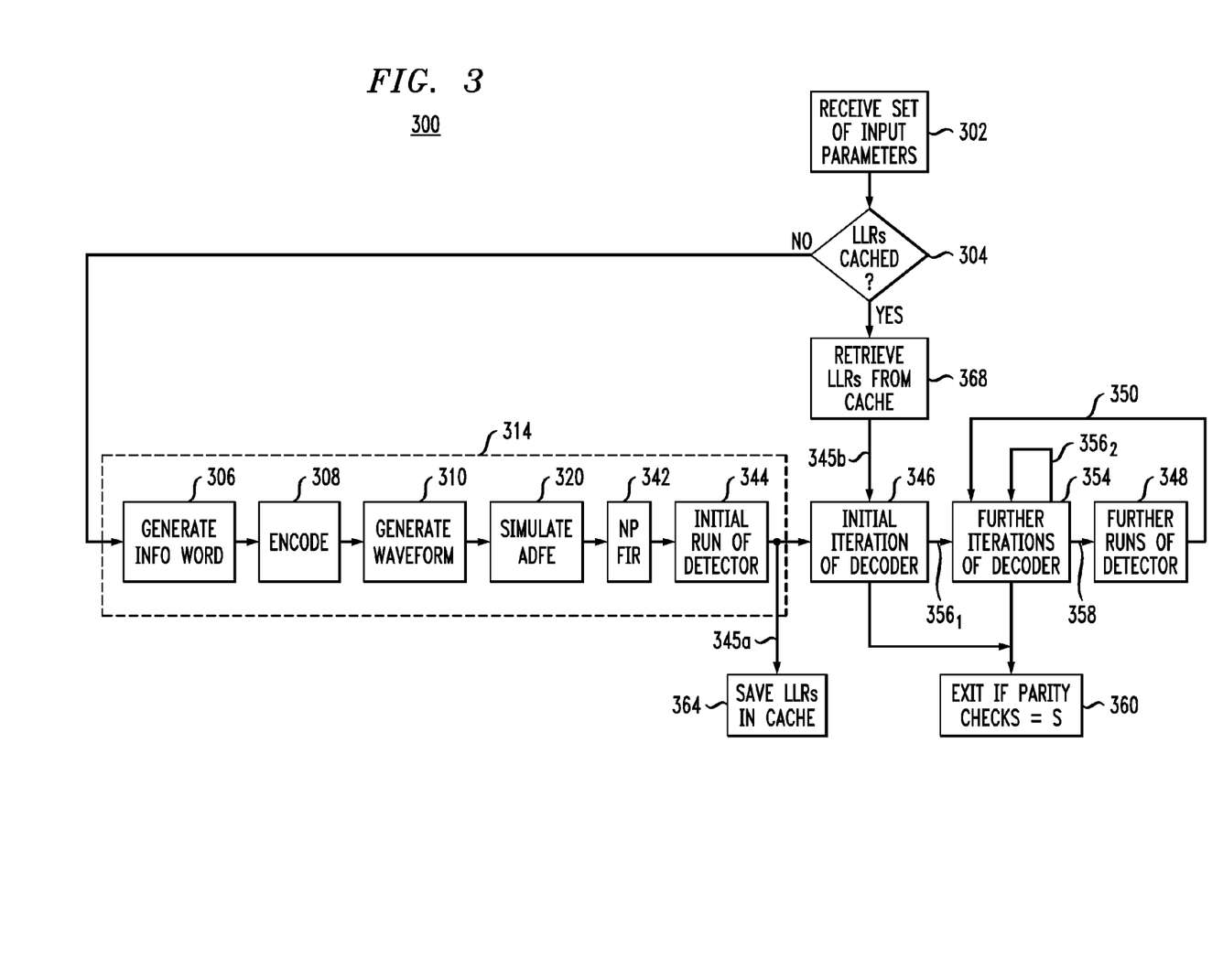
FIG. 3 shows a flowchart of a computer-aided design method that can be used to develop, simulate, refine, and test an implementation of the read-channel shown in FIG. 2 according to one embodiment of the disclosure.

FIG. 3 shows a flowchart of a computer-aided design method 300 that can be used to develop, simulate, refine, and test an implementation of read-channel 200 according to one embodiment of the disclosure. Method 300 can, for example, be implemented as an add-on or plug-in module for a more-general computer-aided design and simulation tool. Method 300 can be embodied in the form of program code, stored in a non-transitory computer-readable storage medium such that, when the program code is loaded into and executed by a computer, the computer becomes an apparatus for carrying out method 300.

Figure 4:
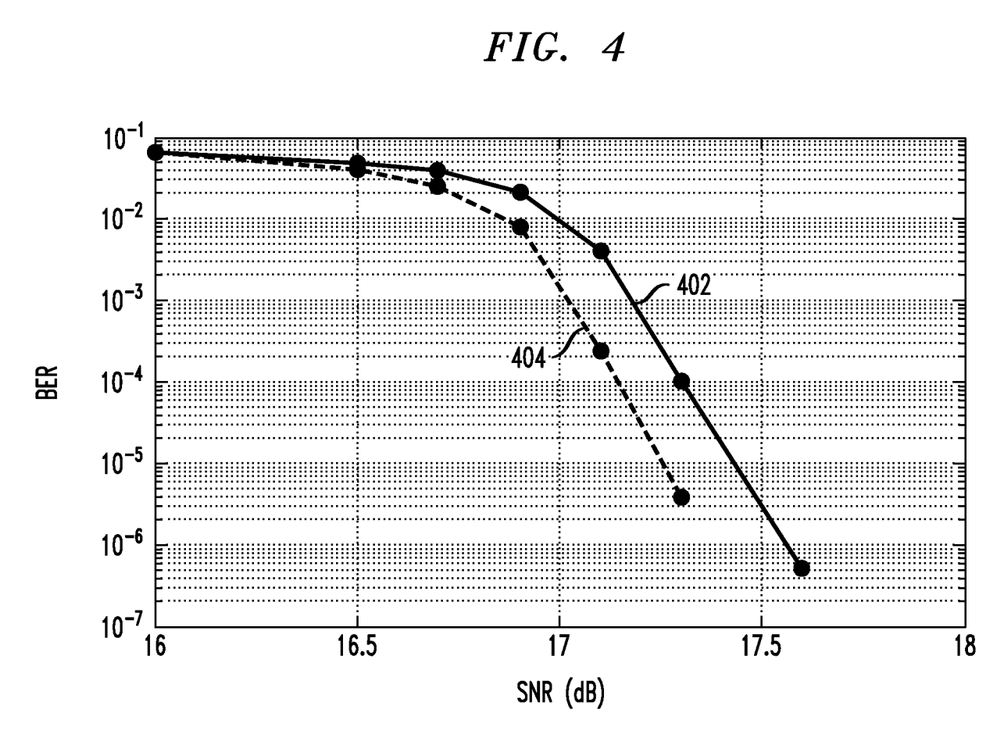
FIG. 4 graphically shows representative results that can be generated using the computer-aided design method shown in FIG. 3 according to one embodiment of the disclosure.

FIG. 4 graphically shows representative results that can be generated using computer-aided design method 300 (FIG. 3) according to one embodiment of the disclosure. More specifically, each of curves 402 and 404 in FIG. 4 shows the simulated BER, as a function of signal-to-noise ratio (SNR) in signal 212, for read channel 200, wherein decoder 254 is configured to use a respective parity-check matrix, H, with the parity-check matrix corresponding to curve 402 being different from the parity-check matrix corresponding to curve 404. One of ordinary skill in the art will understand that the read-channel design/configuration corresponding to curve 404 is expected to result in a better performance of read channel 200 than that corresponding to curve 402. In particular, curve 404 is advantageous over curve 402 because, for the same SNR value, the former curve tends to have a smaller BER than the latter curve.

In general, one of the objectives of method 300 is to test a specific read-channel architecture proposed by the read-channel developer before implementing that architecture in an actual physical VLSI chip. To achieve this objective, method 300 is run multiple times with different parameter sets, e.g., to generate a family of BER curves similar to curves 402 and 404. As already indicated above, the generated BER curves provide convenient means for comparing the performance of different encoding/decoding schemes and for selecting, e.g., an optimal parity-check matrix H for use in the read-channel chip under development.

Referring back to FIG. 3, a representative run of method 300 begins at processing block 302, where an input set of simulation parameters is provided for the run. A representative input set of parameters may include, but is not limited to: (i) code bit density, CBD; (ii) an SNR value; (iii) waveform-generator settings; (iv) a seed value; and (v) encoder/decoder settings. More specifically, a CBD value is a parameter that describes how densely the different domains that represent bits of information on the actual physical carrier are packed with respect to one another. For example, a CBD value can be expressed as a ratio of a FWHM of a magnetic pulse that a representative domain carries to the average distance between neighboring domains. The SNR value and the waveform-generator settings enable method 300 to properly simulate signal 212 (FIG. 2), e.g., in terms of the absolute and relative contribution of various types of noise, such as white noise, jitter, colored noise, etc. The seed value is used, as further detailed below, in the generation of codewords, which are then used for the performance simulation/evaluation of read channel 200 during the run. The specific decoder settings may include an exact form of parity-check matrix H to be tested.

At processing block 304, method 300 checks the contents of a memory (e.g., a cache memory) for whether or not the LLRs corresponding to the simulation parameters received at processing block 302 have been generated previously and saved in the memory. If the answer to the inquiry of processing block 304 is a "no," then the processing is directed to processing block 306. If the answer to the inquiry of processing block 304 is a "yes," then the processing is directed to processing block 368. The latter processing path enables method 300 to bypass the processing blocks marked in FIG. 3 by a dashed-line box 314. As further explained below, e.g., in reference to FIG. 5, the ability of method 300 to sometimes bypass the processing blocks of box 314 provides means for reducing the method's run time, which helps to significantly accelerate the development, simulation, refinement, and testing of a corresponding implementation of read-channel 200.

As further explained below, the processing implemented in the processing blocks marked by box 314 can be made independent of parity-check matrix H and of the corresponding counterpart generator matrix G (which satisfies uGH=0 for any original information word u) when method 300 is used to test different parity-check matrices within a matrix family with an invariant shape, size, and CBD. In this operating mode, a set 345a of LLRs generated at the output of box 314 does not change if the only change in the set of input parameters received at processing block 302 is a change of the parity-check matrix within the matrix family. Method 300 takes advantage of this particular characteristic of the processing blocks marked by box 314 by being configured to (i) save in the memory LLR set 345a generated during an initial run of the method for a parity-check matrix from a matrix family, as indicated by processing block 364, and (ii) instead of rerunning the processing blocks marked by box 314 each time a new set of simulation parameters is received at processing block 302, retrieve the saved LLR set 345b from the memory, as indicated by processing block 368, and start the simulation at processing block 346 for further runs of the method corresponding to other parity-check matrices from the same matrix family.

An operating mode that enables the above-described processing flow in method 300 is hereafter referred to as a "coset mode." A coset mode can be best explained by emphasizing its differences from a regular operating mode of write/read channels.

In a regular operating mode, a write channel, such as write channel 102 (FIG. 1), generates a codeword (e) from a corresponding original information word (u) in accordance with Eq. (1):

$$e = Gu \qquad (1)$$

where e is a binary vector of length n; u is a binary vector of length k; and G is the n×k generator matrix, where n>k are both positive integers. A read channel, such as read channel 104 (FIG. 1), attempts to recover codeword e from a corresponding noisy read signal, such as read signal 142 (FIG. 1), using the parity checks defined by Eq. (2):

$$He = 0 \qquad (2)$$

where H is the parity-check matrix. Since G and H are related, a regular encoding process implicitly depends on parity-check matrix H.

Figure 5:
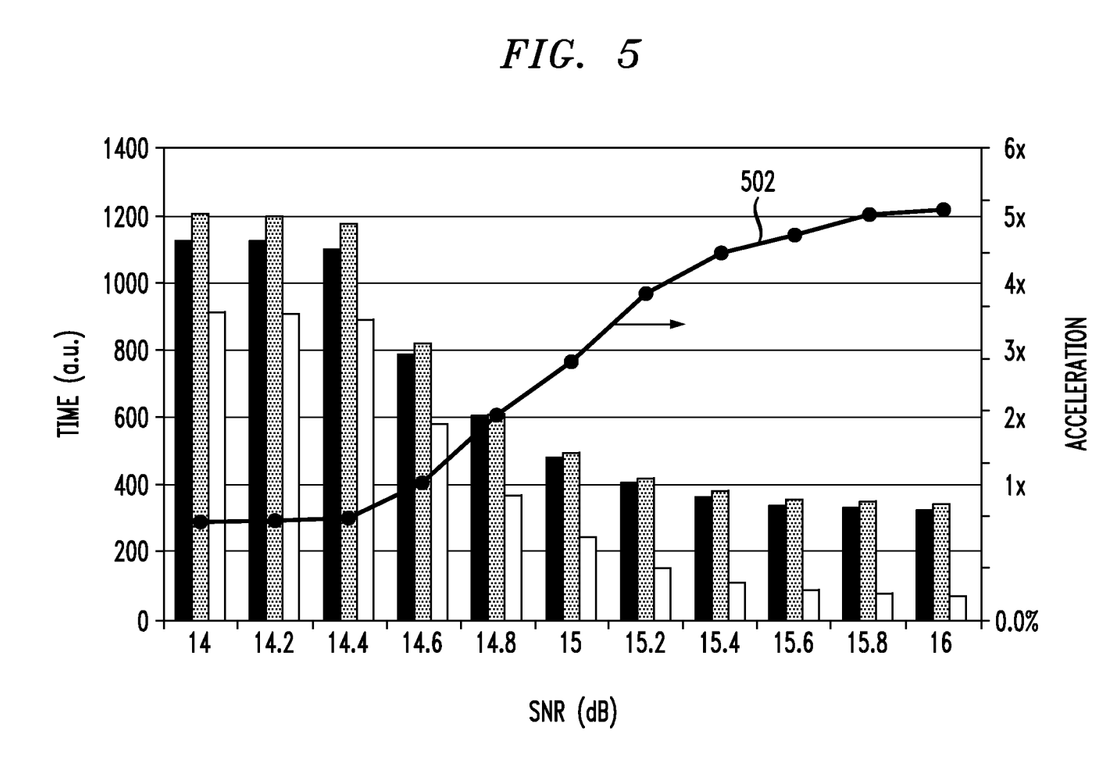
FIG. 5 graphically shows certain performance characteristics of the computer-aided design method shown in FIG. 3 according to one embodiment of the disclosure.

In a coset mode, instead of using Eq. (1), the encoder generates codeword e from original information word u in accordance with Eq. (3):

$$e = u \| r \qquad (3)$$

where "∥" denotes concatenation; and r is a pseudo-random binary vector of length (n−k). Vector r is unequivocally defined by a corresponding "seed value," which is specified at processing block 302 as part of the input set of simulation parameters. More specifically, when provided with a specific seed value, a pseudo-random sequence generator generates vector r in a deterministic manner. The appearance of randomness among the sequentially generated codewords at the output of processing block 308 is maintained, for simulation purposes, by feeding an appropriate, relatively large number of different seed values for different runs of method 300. Since Eq. (3) does not depend on generator matrix G, a coset-mode encoding process does not depend on and is not a function of parity-check matrix H. This property of coset-mode encoding provides a mathematical basis for method 300 to sometimes bypass the processing blocks marked by box 314 using a memory-content check implemented at processing block 304. Advantageously, the ability to recycle some previously generated LLR sets can be used to significantly reduce the total time that is required for appropriate testing of the read-channel architecture proposed by the developer (also see FIG. 5).

Instead of using Eq. (2), a decoder operating in a coset mode attempts to recover codeword e from the corresponding set of LLR values using the parity checks defined by Eq. (4):

$$He = s \qquad (4)$$

where s is a syndrome. For each codeword e and parity-check matrix H, the decoder can calculate a corresponding syndrome s and then use it to define parity checks for the decoder to use in decoding the corresponding set of LLR values. A known property of syndrome-based decoding defined by Eq. (4) is that its error-rate characteristics very closely approximate the error-rate characteristics of the same decoder operating in a regular operating mode. Therefore, the coset mode can be used, e.g., to generate a family of BER curves corresponding to different parity-check matrices H that is analogous to that shown in FIG. 4. The generated BER curves can then be used in a conventional manner for selecting an optimal parity-check matrix for read channel 200 from a relatively large number of candidate matrices. Also note that a regular operating mode corresponds to a coset mode in which the syndrome vector is set to s=0. Additional details on the approximate error-rate equivalency of coset and regular operating modes can be found, e.g., in (i) an article by C.-C. Wang, S. R. Kulkarni, and H. V. Poor, entitled "On the Typicality of the Linear Code Among the LDPC Coset Code Ensemble," published in the proceedings of the 2005 Conference on Information Sciences and Systems, held at the Johns Hopkins University, on Mar. 16-18, 2005; and (ii) an article by Kuen-Tsair Lay, Chin-Ho Hou, and Lun-Chung Peng, entitled "Nonhomogeneous LDPC Codes and Their Application to Encrypted Communication," published in the proceedings of the Third International Conference on Communications and Mobile Computing, held in 2011, both of which articles are incorporated herein by reference in their entirety.

At processing block 306, method 300 generates one or more information words u for use in method 300. Processing block 306 is generally configured to simulate the operation of a data source, such as data source 110 (FIG. 1).

At processing block 308, the one or more information words u received from processing block 306 are converted into the corresponding one or more codewords e. The conversion is performed in accordance with Eq. (4) and is based on the seed value received at processing block 302. Processing block 308 is generally configured to simulate the operation of an encoder, such as LDPC encoder 120 (FIG. 1).

At processing block 310, the one or more codewords e received from processing block 308 are converted into the corresponding one or more waveforms. The conversion is performed based on the waveform-generator settings received at processing block 302. Processing block 310 is generally configured to simulate the digitized output of a storage-medium sensor, such as electrical digital signal 224 generated by sensor 210 and ADC 222 (see FIG. 2).

At processing block 320, the one or more waveforms received from processing block 310 are digitally filtered to generate the corresponding one or more filtered waveforms. Processing block 320 is generally configured to simulate the operation of configurable digital filters in an ADFE, such as CTF 226, DPLL 230, and waveform equalizer 234 in ADFE 220 (see FIG. 2).

At processing block 342, the one or more filtered waveforms received from processing block 320 are subjected to digital equalization to generate the corresponding one or more equalized waveforms. Processing block 342 is generally configured to simulate the operation of an NP-FIR equalizer, such as NP-FIR equalizer 242 (FIG. 2).

Processing blocks 344, 346, 354, and 348 are generally configured to simulate the operation of a sequence detector and an LDPC decoder, such as sequence detector 248 and LDPC decoder 254 in read channel 200 (see FIG. 2). As already indicated above in the description of read channel 200, a sequence detector and an LDPC decoder may have to perform multiple iterations/restarts while attempting to converge on a valid codeword. Processing block 344 is configured to simulate an initial run of the sequence detector. Processing block 348 is configured to simulate the subsequent run(s) (if any) of the sequence detector provided that the simulated LDPC decoder sends to the sequence detector a corresponding request to regenerate the LLR values corresponding to a failed decoding attempt. Similarly, processing block 346 is configured to simulate an initial run (first iteration) of the LDPC decoder. Processing block 354 is configured to simulate the subsequent iteration(s) (if any) performed by the LDPC decoder.

Processing block 344 is configured to generate LLR set 345a. As already indicated above, in a coset mode, LLR set 345a does not depend on parity-check matrix H used in the LDPC decoder. When the processing blocks within box 314 are not bypassed, LLR set 345a is saved in the memory (if necessary, along with the corresponding codeword e) by executing processing block 364. When the processing blocks within box 314 are bypassed, a copy of the saved LLR set 345a (labeled in FIG. 3 as 345b) is retrieved from the memory by executing processing block 368 and provided as input to processing block 346.

Arrow $356_1$ denotes a transition between the processing corresponding to the first iteration of the LDPC decoder and the processing corresponding to its second iteration. Arrow $356_2$ denotes a transition between the processing corresponding to any two consecutive iterations performed by the LDPC decoder, starting from the transition between the second and third iterations. Transitions $356_1$ and $356_2$ correspond to the processing transitions in read channel 200 indicated in FIG. 2 by looped arrow 256.

Arrow 358 denotes an LLR-regeneration request sent from the LDPC decoder to the sequence detector. LLR-regeneration request 358 simulates LLR-regeneration request 258 in read channel 200 (see FIG. 2).

Arrow 350 denotes a regenerated set of LLR values provided by the sequence detector to the LDPC decoder in response to LLR-regeneration request 358. Note that regenerated LLR set 350 does depend on parity-check matrix H used in the LDPC decoder. Regenerated LLR set 350 simulates a regenerated LLR set provided by sequence detector 248, via output signal 250, to LDPC decoder 254 in response to LLR-regeneration request 258 (see FIG. 2).

The simulated LDPC decoder implemented in method 300 by processing blocks 346 and 354 operates in a coset mode and, as such, is configured to use nonzero-syndrome-based decoding in accordance with Eq. (4). The decoding process is terminated when the multiplication of the operative parity-check matrix H by the codeword deduced by the LDPC decoder from the corresponding set of LLR values (which can be LLR set 345a,b or regenerated LLR set 350) produces a correct syndrome vector s. Depending on the input parameters received at processing block 302 and/or original information word u, this decoding termination can occur at processing block 346 or at processing block 354, as indicated in FIG. 3 by the arrows connecting these two processing blocks to a parity-check subroutine 360. More specifically, subroutine 360 implements a set of parity checks in accordance with Eq. (4) and can be called in each of processing blocks 346 and 354 when said parity checks need to be calculated.

As already indicated above, multiple runs of method 300 corresponding to different sets of input parameters and different parity-check matrices can be used to generate sufficient error-rate statistics, based on which a family of error-rate curves, e.g., analogous to BER curves 402 and 404 (FIG. 4), can be constructed. This family of curves can then be used to select an optimal parity-check matrix H for read channel 200 under development.

FIG. 5 graphically shows certain performance characteristics of computer-aided design method 300 (FIG. 3) according to one embodiment of the disclosure. More specifically, a bar graph in FIG. 5 shows the relative run time for different configurations of method 300 as a function of SNR. A curve 502 graphically shows an acceleration of the simulation process that can be achieved by bypassing the processing blocks marked in FIG. 3 by box 314.

Referring to the bar graph in FIG. 5, for each SNR value, three bars are shown. The left of the three bars shows a representative amount of time that is needed for a single run of method 300 when the bypass route through processing block 368 and the memory saves implemented by processing block 364 are both disabled. The middle of the three bars shows a representative amount of time that is needed for a single run of method 300 when the bypass route through processing block 368 is disabled, but the memory saves implemented by processing block 364 are performed between the execution of processing blocks 344 and 346. The right of the three bars shows a representative amount of time that is needed for a single run of method 300 when the processing is directed through processing block 368, thereby bypassing the processing blocks marked by box 314.

The height difference between the left and middle bars indicates the additional amount of time associated with the placement of LLR set 345a into the memory. The height difference between the left and right bars indicates the amount of time that can be saved by reusing a previously saved LLR set 345a, e.g., by retrieving its copy 345b from the memory. In general, the greater is the number of different parity-check matrices that need to be tested, the greater are the time savings. This is true because the number of runs corresponding to the right of the three bars increases approximately linearly with the number of parity-check matrices while the number of runs corresponding to the middle of the three bars remains approximately constant. The time savings become especially pronounced at relatively high SNR values at which method 300 can typically converge on a correct codeword after only a single run of the sequence detector and the LDPC decoder, which causes an early exit at processing block 346 and makes unnecessary the execution of processing blocks 354 and 348 (see FIG. 3). Curve 502 indicates that these time savings can be used to accelerate the simulation process by up to a factor of about five or even larger.

Figure 6:
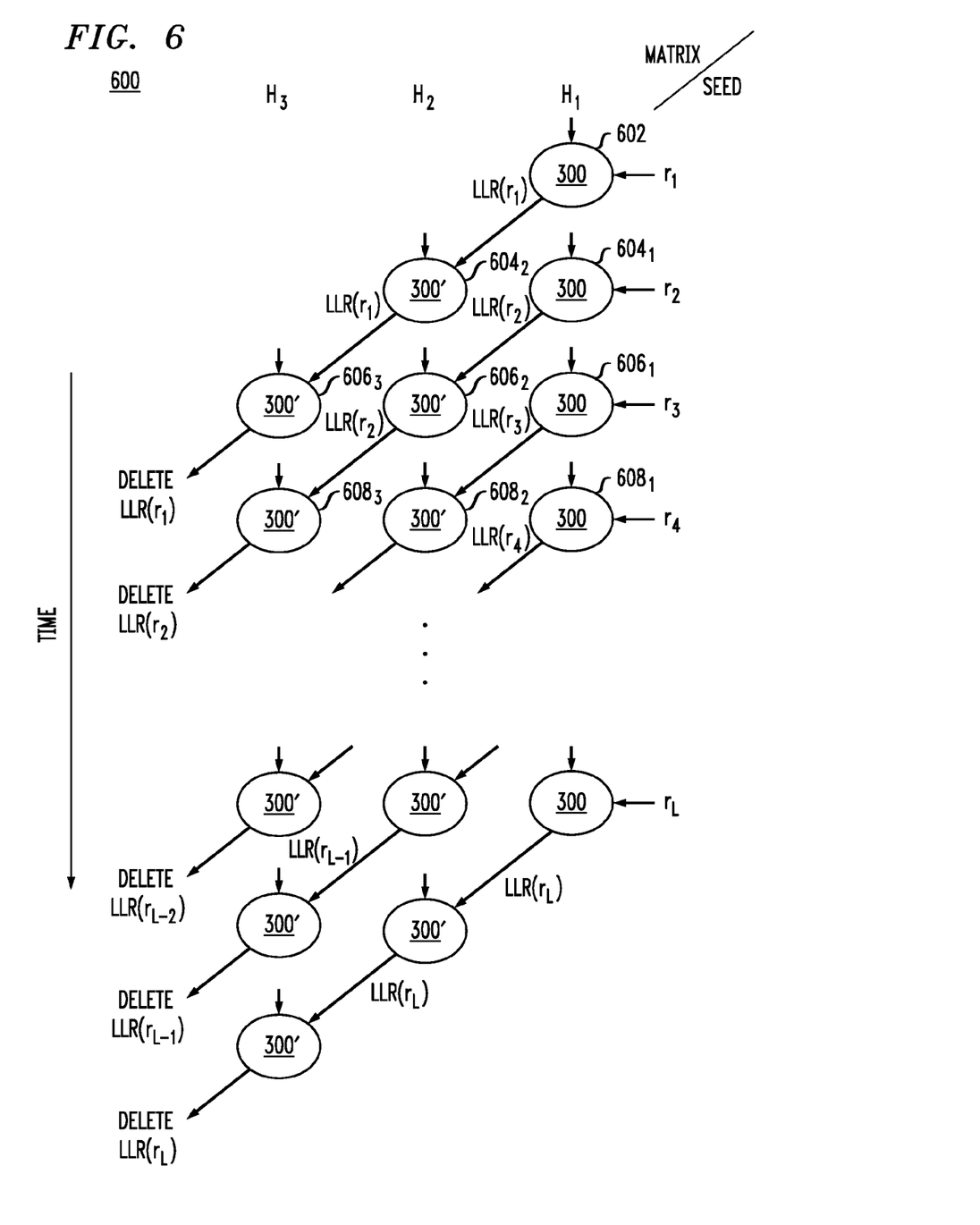
FIG. 6 shows a flowchart of a method of memory pipelining that can be used in conjunction with the computer-aided design method shown in FIG. 3 according to one embodiment of the disclosure.

FIG. 6 shows a flowchart of a method 600 of memory pipelining that can be used in conjunction with computer-aided design method 300 (FIG. 3) according to one embodiment of the disclosure. For illustration purposes, method 600 is described as (i) being run on a multi-core processor, a computer cluster, or a computer cloud having three processing units and (ii) being used to test three different parity-check matrices ($H_1$, $H_2$, and $H_3$) for L different seed values ($r_1, r_2, \ldots, r_L$). One of ordinary skill in the art will appreciate that method 600 can similarly be (i) run on a different number of processing units and (ii) used to test a different number of parity-check matrices for a different number of seed values. The number of processing units does not have to be the same as the number of parity-check matrices that is being tested.

Advantageously, method 600 can be used to reduce the memory space used for storing different LLR sets 345 (see FIG. 3).

The vertical axis in FIG. 6 represents time, which increases in the direction indicated by the "time" arrow shown at the left side of the figure. At any time instant, at most three different instances of method 300 are being executed on the respective processing units. An instance of method 300 labeled in FIG. 6 as "300" does not bypass the processing blocks marked in FIG. 3 by box 314. As a result, each such instance of method 300 generates a corresponding LLR set 345a and saves it in the memory by executing processing block 364 (see FIG. 3). An instance of method 300 labeled in FIG. 6 as "300'" bypasses the processing blocks marked by box 314 and retrieves a corresponding LLR-set copy 345b from the memory by executing processing block 368 (see FIG. 3).

Method 600 begins by executing a copy 602 of method 300 on one of the three processing units, with a set of input parameters that specify parity-check matrix $H_1$ and seed value $r_1$. During its execution, copy 602 generates a corresponding LLR set 345a (labeled in FIG. 6 as LLR($r_1$)) and saves it in the memory.

At a later time, copies $604_1$ and $604_2$ are executed on two respective processing units. Copy $604_2$ is initialized with a set of input parameters that specify parity-check matrix $H_2$ and seed value $r_1$. As such, copy $604_2$ can bypass the processing blocks marked by box 314 and, instead, retrieve the set LLR($r_1$) previously generated by copy 602 from the memory. Copy $604_1$ is initialized with a set of input parameters that specify parity-check matrix $H_1$ and seed value $r_2$. During its execution, copy $604_1$ generates a corresponding LLR set 345a (labeled in FIG. 6 as LLR($r_2$)) and saves it in the memory.

At another later time, copies $606_1$-$606_3$ are executed on three respective processing units. Copy $606_3$ is initialized with a set of input parameters that specify parity-check matrix $H_3$ and seed value $r_1$. As such, copy $606_3$ can bypass the processing blocks marked by box 314 and, instead, retrieve the set LLR($r_1$) previously generated by copy 602 from the memory. When the execution of copy $606_3$ is completed, the set LLR($r_1$) is purged from the memory, thereby freeing the storage space for other, later-generated LLR sets. Copy $606_2$ is initialized with a set of input parameters that specify parity-check matrix $H_2$ and seed value $r_2$. As such, copy $606_2$ can bypass the processing blocks marked in FIG. 3 by box 314 and, instead, retrieve the set LLR($r_2$) previously generated by copy $604_1$ from the memory. Copy $606_1$ is initialized with a set of input parameters that specify parity-check matrix $H_1$ and seed value $r_3$. During its execution, copy $606_1$ generates a corresponding LLR set 345a (labeled in FIG. 6 as LLR($r_3$)) and saves it in the memory.

At yet another later time, copies $608_1$-$608_3$ are executed on three respective processing units. Copy $608_3$ is initialized with a set of input parameters that specify parity-check matrix $H_3$ and seed value $r_2$. As such, copy $608_3$ can bypass the processing blocks marked by box 314 and, instead, retrieve the set LLR($r_2$) previously generated by copy $604_1$ from the memory. When the execution of copy $608_3$ is completed, the set LLR($r_2$) is purged from the memory, thereby freeing the storage space for other, later-generated LLR sets. Copy $608_2$ is initialized with a set of input parameters that specify parity-check matrix $H_2$ and seed value $r_3$. As such, copy $608_2$ can bypass the processing blocks marked by box 314 and, instead, retrieve the set LLR($r_3$) previously generated by copy $606_1$ from the memory. Copy $608_1$ is initialized with a set of input parameters that specify parity-check matrix $H_1$ and seed value $r_4$. During its execution, copy $608_1$ generates a corresponding LLR set 345a (labeled in FIG. 6 as LLR($r_4$)) and saves it in the memory.

The pipelined execution of method 600 continues in this manner, as indicated in FIG. 6, until all possible combinations of parity-check matrices $H_1$-$H_3$ and seed values $r_1$-$r_L$ have been tested. The deletion of the no-longer-needed LLR sets performed as described above advantageously enables the corresponding multi-core processor, computer cluster, or computer cloud to be operational even with a relatively small memory space allocated for this particular task.

Figure 7:
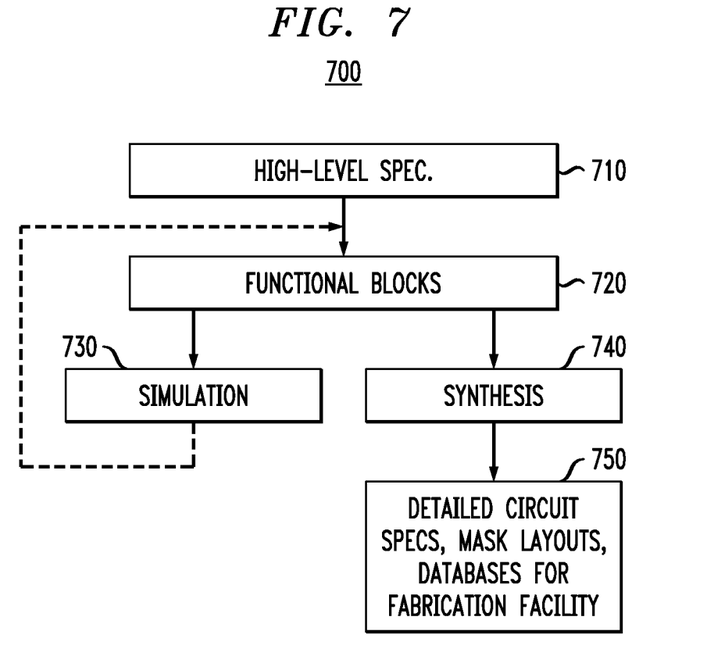
FIG. 7 shows a flowchart of a method of designing an integrated circuit in which various embodiments of the computer-aided design method shown in FIG. 3 can be practiced.

FIG. 7 shows a flowchart of a method 700 of designing an integrated circuit in which various embodiments of methods 300 (FIG. 3) and 600 (FIG. 6) can be practiced. In one embodiment, method 700 is a relatively general computer-aided design and simulation tool that can be used to develop, simulate, synthesize, and produce various types of integrated circuits, including but not limited to read channel 200 (FIG. 2). Various embodiments of methods 300 (FIG. 3) and 600 (FIG. 6) can be used in method 700, e.g., to implement step 730.

In general, a modern integrated circuit is designed by humans (e.g., one or more electrical engineers) to be built by machines at a fabrication facility. Hence, method 700 acts as a translator between the human designers and the fabricating machines. More specifically, a CAD system running method 700 has (i) a human interface, e.g., graphical and/or textual, that enables a designer to direct the design process toward a desired outcome and (ii) a generator of digital specifications, layouts, and/or databases that can be used to program the various machines at the fabrication facility.

At step 710 of method 700, the integrated circuit that is being designed is described in terms of its behavior. One of the goals of this step is to produce high-level technical specifications that will result in a product that fulfills an intended purpose.

At step 720, the design at the behavioral level is elaborated in terms of functional blocks. The behavior of each functional block is usually detailed, but the description of the functional block still remains at an abstract level, without detailing its internal circuit structure to the level of individual circuit elements, such as gates, switches, etc. The interaction of different functional blocks with one another is properly detailed in accordance with the intended overall function of the integrated circuit.

At step 730, the circuit architecture produced at step 720 is tested through a simulation process. Simulation is typically carried out using a set of dedicated simulation tools, e.g., including but not limited to those embodying methods 300 and 600. With every simulation run, the obtained simulation results are studied and analyzed to identify non-optimal behaviors and/or design errors. Simulation tools can also be used to compare the performance of different versions/configurations of the same circuit. Steps 720 and 730 are usually repeated in a cyclic iterative process (indicated in FIG. 7 by the dashed arrow) until error-free and/or optimal circuit architecture and configuration are obtained.

At step 740, the circuit architecture and configuration obtained by repeating steps 720 and 730 is converted into a corresponding hardware realization. Two often-used approaches here are: (1) to realize the circuit using an FPGA or (2) to realize the circuit is as an ASIC. An FPGA route may be more attractive for limited-volume production and/or for a short-development cycle. In various embodiments, step 740 may include one or more of the following sub-steps: selecting circuit components from a library or an FPGA, floor planning, placement, routing, and post-layout simulation. Some of the sub-steps of step 740 may have to be carried out iteratively to yield best results.

At step 750, a final set of detailed circuit specifications, mask layouts, and/or databases is generated based on the results of step 740. These items are then transferred to a fabrication facility to enable fabrication of the integrated circuit thereat.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The present inventions may be embodied in other specific apparatus and/or methods. The described embodiments are to be considered in all respects as only illustrative and not restrictive. In particular, the scope of the invention is indicated by the appended claims rather than by the description and figures herein. All changes that come within the meaning and range of equivalency of the claims are to be embraced within their scope.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, e.g., digital memories, magnetic storage media such as magnetic disks or tapes, hard drives, or optically readable digital data storage media. The embodiments are also intended to cover computers programmed to perform said steps of methods described herein.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those of ordinary skill in the art that any block diagrams herein represent conceptual views of illustrative circuitry embodying the principles of the invention. Similarly, it will be appreciated that any flowcharts, flow diagrams, state transition diagrams, pseudo code, and the like represent various processes which may be substantially represented in computer readable medium and so executed by a computer or processor, whether or not such computer or processor is explicitly shown.

What is claimed is:

1. A computer-aided design method comprising:
   (A) simulating performance of a read channel having a sequence detector and a turbo-decoder configured to use a first parity-check matrix, wherein a first set of log-likelihood-ratio values is generated by simulating an output of the sequence detector; and
   (B) simulating performance of said read channel with the turbo-decoder being configured to use a second parity-check matrix different from the first parity-check matrix, wherein the first set of log-likelihood-ratio values is used to simulate performance of the turbo-decoder configured to use the second parity-check matrix.

2. The method of claim 1, wherein the turbo-decoder is a low-density parity-check decoder.

3. The method of claim 1, wherein the read channel is adapted to read data saved on a magnetic disk platter.

4. The method of claim 1, wherein step (A) comprises:
   (A1) generating a codeword by concatenating an information word and a pseudo-random bit sequence;
   (A2) generating a first syndrome vector by multiplying the first parity-check matrix and the codeword; and
   (A3) decoding the first set of log-likelihood-ratio values based on the first parity-check matrix and the first syndrome vector.

5. The method of claim 4, wherein step (A3) comprises:
   (A3a) temporarily halting the decoding if a number of decoding iterations exceeds a threshold value;
   (A3b) generating a second set of log-likelihood-ratio values based on the first set of log-likelihood-ratio values and one or more characteristics of the decoding prior to being temporarily halted; and
   (A3c) decoding the second set of log-likelihood-ratio values based on the first parity-check matrix and the first syndrome vector.

6. The method of claim 4, wherein step (A) further comprises:
   (A4) generating a waveform based on the codeword; and
   (A5) generating the first set of log-likelihood-ratio values by applying maximum-likelihood sequence estimation to the waveform.

7. The method of claim 4, wherein the first syndrome vector has at least one non-zero component.

8. The method of claim 4, further comprising generating the pseudo-random bit sequence in a deterministic manner based on a corresponding seed value.

9. The method of claim 4, wherein step (B) comprises:
   (B1) generating a second syndrome vector by multiplying the second parity-check matrix and the codeword; and
   (B2) decoding the first set of log-likelihood-ratio values based on the second parity-check matrix and the second syndrome vector.

10. The method of claim 9, wherein step (B) further comprises:
    (B3) temporarily halting the decoding if a number of decoding iterations exceeds a threshold value;
    (B4) generating a second set of log-likelihood-ratio values based on the first set of log-likelihood-ratio values and one or more characteristics of the decoding prior to being temporarily halted; and
    (B5) decoding the second set of log-likelihood-ratio values based on the second parity-check matrix and the second syndrome vector.

11. The method of claim 1, wherein:
    step (A) comprises generating a first error-rate measure corresponding to the first parity-check matrix;
    step (B) further comprises generating a second error-rate measure corresponding to the second parity-check matrix; and
    the method further comprises selecting one of the first and second parity-check matrices for use in the read channel based the first and second error-rate measures.

12. The method of claim 11, wherein each of the first and second error-rate measures includes a respective dependence of bit-error rate on a signal-to-noise ratio.

13. The method of claim 1, wherein:
    step (A) comprises saving in a memory the first set of log-likelihood-ratio values; and
    step (B) comprises retrieving from the memory the first set of log-likelihood-ratio values for simulating performance of the turbo-decoder configured to use the second parity-check matrix.

14. The method of claim 1, further comprising:
    performing step (A) on a first processing unit; and
    performing step (B) on a different second processing unit.

15. The method of claim 14, wherein:
    step (A) comprises saving in a memory the first set of log-likelihood-ratio values;
    step (B) comprises retrieving from the memory the first set of log-likelihood-ratio values for simulating performance of the turbo-decoder configured to use the second parity-check matrix; and
    the first processing unit and the second processing unit have a shared access to the memory.

16. The method of claim 1, further comprising:

(C) generating a database based on results of the simulated performances of steps (A) and (B) to enable a fabrication facility to fabricate an integrated circuit embodying the read channel.

17. An integrated circuit fabricated using a computer-aided design method that comprises:

(A) simulating performance of a read channel having a sequence detector and a turbo-decoder configured to use a first parity-check matrix, wherein a first set of log-likelihood-ratio values is generated by simulating an output of the sequence detector; and (B) simulating performance of said read channel with the turbo-decoder being configured to use a second parity-check matrix different from the first parity-check matrix, wherein the first set of log-likelihood-ratio values is used to simulate performance of the turbo-decoder configured to use the second parity-check matrix; and wherein the integrated circuit has been fabricated based on results of the simulated performances of steps (A) and (B).

18. The integrated circuit of claim 17, wherein the computer-aided design method further comprises (C) generating a database based on the results of the simulated performances of steps (A) and (B) to enable a fabrication facility to fabricate an integrated circuit embodying the read channel; and wherein the integrated circuit has been fabricated at the fabrication facility using the database of step (C).

19. A non-transitory machine-readable medium, having encoded thereon program code, wherein, when the program code is executed by a machine, the machine implements a computer-aided design method, the computer-aided design method comprising:

(A) simulating performance of a read channel having a sequence detector and a turbo-decoder configured to use a first parity-check matrix, wherein a first set of log-likelihood-ratio values is generated by simulating an output of the sequence detector; and (B) simulating performance of said read channel with the turbo-decoder being configured to use a second parity-check matrix different from the first parity-check matrix, wherein the first set of log-likelihood-ratio values is used to simulate performance of the turbo-decoder configured to use the second parity-check matrix.

* * * * *